United States Patent [19]

Huang

[11] Patent Number: 5,150,187
[45] Date of Patent: Sep. 22, 1992

[54] INPUT PROTECTION CIRCUIT FOR CMOS DEVICES

[75] Inventor: Eddy C. Huang, San Jose, Calif.

[73] Assignee: VLSI Technology, Inc., San Jose, Calif.

[21] Appl. No.: 665,386

[22] Filed: Mar. 5, 1991

[51] Int. Cl.$^5$ .................................................. H01L 27/02
[52] U.S. Cl. ......................................... 357/43; 357/46
[58] Field of Search ........................................ 357/43, 46

[56] References Cited

U.S. PATENT DOCUMENTS 4,947,230 8/1990 Kapoor .................................. 357/46

Primary Examiner—John D. Lee
Assistant Examiner—Robert E. Wise
Attorney, Agent, or Firm—Flehr, Hohbach, Test, Albritton & Herbert

[57] ABSTRACT

A shared protection circuit protects an MOS circuit, herein called a chip, from the destructive effects of electrostatic discharges conducted by any of the circuits input/output pins. The shared protection circuit is coupled to the high and low voltage source nodes used by the entire chip. In a preferred embodiment which protects against positive voltage electrostatic discharges, each input/output pin of the chip node is coupled by a diode to the high voltage source node so that a positive voltage transient on any input/output node will be transmitted to the high voltage source node. A Darlington pair of parasitic bipolar transistors conduct charge from the high voltage source node to the low voltage source node when turned on. A bias circuit turns on the Darlington pair of parasitic bipolar transistors when a positive voltage transient having at least a predefined magnitude occurs on the high voltage source node. As a result, the shared protection circuit will drain current from any input/output node, via the high voltage source node, when a positive voltage transient occurs thereon. The bias circuit also automatically turns off the Darlington pair of parasitic bipolar transistors after it has discharged excess voltage from the high voltage source node.

6 Claims, 2 Drawing Sheets

INPUT PROTECTION CIRCUIT FOR CMOS DEVICES

The present invention relates to input protection circuits for protecting CMOS semiconductor devices from large electrostatic discharge voltages as well as input currents that may cause latchup.

BACKGROUND OF THE INVENTION

The purpose of an input protection circuit is to protect input gates, diffusions, metal lines, and other internal components of a chip from the potentially destructive effects of large electrostatic discharge (ESD) voltages applied to an input pad. Input protection circuits are typically formed along the periphery of semiconductor circuits, generally next to the input pads of the circuit. In most prior art devices, a separate input protection circuit is coupled to each input node, and some such schemes require an extra ion implant step for input/output transistors to enhance their performance when subjected to an ESD. Furthermore, the transistors in such input protection circuits typically must be large so as to be able to quickly absorb the current from an electrostatic discharge. As a result, such input protection circuits can occupy a sizeable amount of space, which increases the complexity and cost of the circuit.

The present invention provides a input protection circuit for CMOS devices that can be shared by many input/output nodes, thereby substantially reducing the complexity and amount of space occupied by input protection circuitry.

SUMMARY OF THE INVENTION

In summary, the present invention is an input protection circuit for protecting MOS semiconductor circuits from electrostatic discharge voltages and from developing circuit latchup. More particularly, the present invention is a shared protection circuit which protects an MOS circuit, herein called a chip, from the destructive effects of electrostatic discharges conducted by any of the circuits input/output pins. Thus a single shared protection circuit can be used to protect against electrostatic discharges on all of the chip's input/output pins.

The shared protection circuit is coupled to the high and low voltage source nodes used by the entire chip. In a preferred embodiment which protects against positive voltage electrostatic discharges, each input/output pin of the chip is coupled by a diode to the high voltage source node so that a positive voltage transient on any input/output node will be transmitted to the high voltage source node. A Darlington pair of parasitic bipolar transistors conduct charge from the high voltage source node to the low voltage source node when turned on. A bias circuit turns on the Darlington pair of parasitic bipolar transistors when a positive voltage transient having at least a predefined magnitude occurs on the high voltage source node. As a result, the shared protection circuit will drain current from any input/output node, via the high voltage source node, when a positive voltage transient occurs. The bias circuit also automatically turns off the Darlington pair of parasitic bipolar transistors after it has discharged excess voltage from the high voltage source node.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

For the purposes of this description, the term VDD refers to the high voltage source used in a circuit (e.g., 5 volts in many circuits) and VSS refers to the low voltage source used in the circuit (e.g., 0 volts, or ground).

Figure 1:
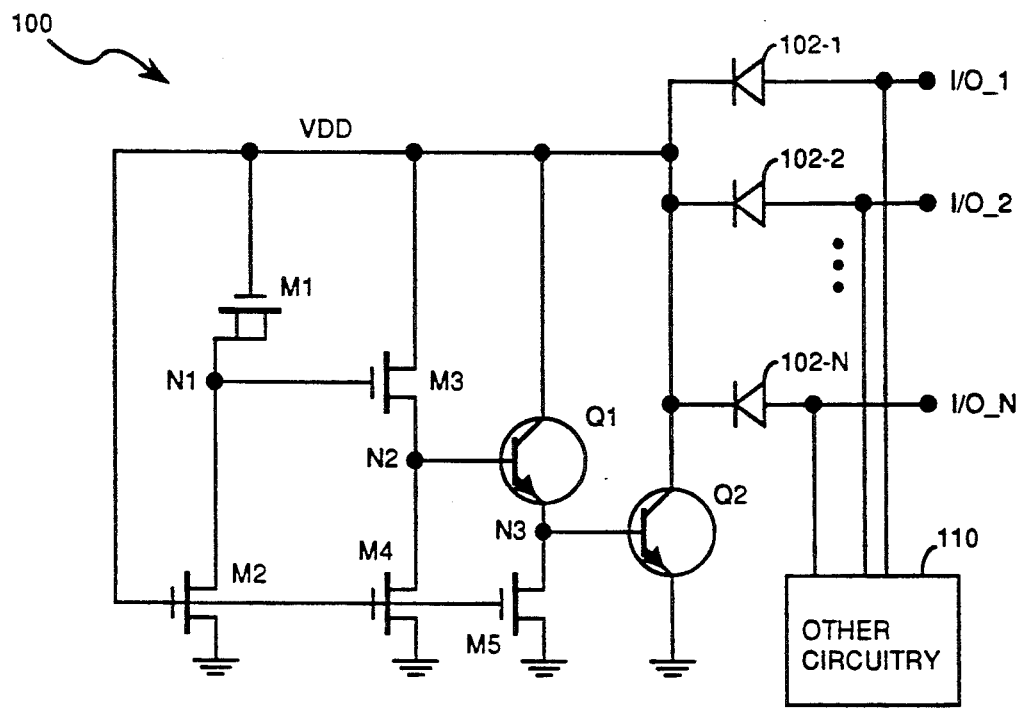
FIGS. 1 and 2 schematically depict two preferred embodiments of an input protection device in accordance with the present invention.

Referring to FIG. 1, the input protection circuit 100 of the present invention is shown for an N-substrate CMOS circuit. The input protection circuit 100 can be placed anywhere on a CMOS integrated circuit chip so long as connections to both VDD and VSS are available. The purpose of the protection circuit 100 is to prevent high ESD voltages asserted on any I/O pin or node from reaching and destroying the circuits 110 internal to the chip that are coupled to those I/O nodes. More particularly, all the I/O nodes for the entire chip may be coupled to one protection circuit 100, which circuit provides the discharge path for all of the I/O nodes. Since each I/O node needs only to be coupled to the VDD node by a diode in order for it to be protected by the shared protection circuit 100, and VDD must be present in virtually every subcircuit in the chip, it is quite possible to use a single shared protection circuit for an entire chip. Alternately, if it is difficult to connect all the I/O nodes to a single protection circuit 100 for any reason, a few such protection circuits may be used, each connected to a plurality of nearby I/O nodes.

The input protection circuit 100 is designed to protect against positive voltage electrostatic discharges because positive ESD's have been shown to cause the worst damage to the input/output (I/O) transistors in CMOS circuits. Each input/output node I/O_1 to I/O_N is coupled to the VDD node by a diode 102 so that a positive voltage static discharge asserted on any I/O pin or pad will be passed to VDD. Excess voltage on VDD is then discharged through the Darlington bipolar transistors Q1 and Q2. Transistors Q1 and Q2 are CMOS parasitic bipolar transistors.

Each diode 102 may be coupled to its corresponding I/O node by either a P-channel output transistor or by a connection to a P diffusion region that is connected to the I/O node.

Figure 2:
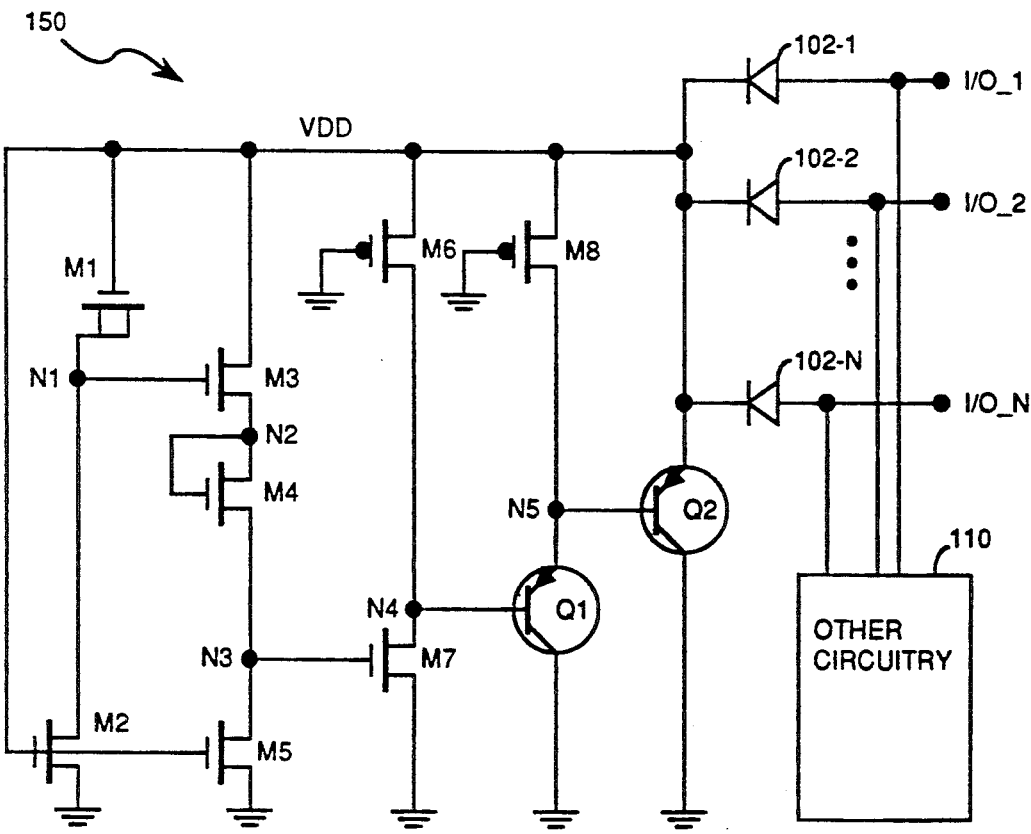

FIG. 1 shows a preferred embodiment of the ESD protection circuit for N-substrate CMOS circuits, while FIG. 2 shows the preferred embodiment of the protection circuit of P-substrate CMOS circuits. In both circuits the devices whose labels begin with the letter "Q" are parasitic bipolar devices, and the devices whose labels begin with the letter "M" are MOS transistors that are used to form a bias circuit for the parasitic bipolar devices. That is, the MOS devices control when the parasitic bipolar devices turn on and off.

In the circuit of FIG. 1, N-channel transistor M1 is used as a capacitor to couple positive going transients, caused by electrostatic discharges on any I/O node, from VDD to node N1. Transistor M3 is then turned on, bringing node N2 high to drive the base of parasitic transistor Q1, which in turn drives the base of Q2 on node N3. The Darlington pair Q1-Q2 is now turned on to discharge the VDD node to ground. The Darlington pair Q1-Q2 can be designed, using standard circuit design techniques, to strongly turn on when VDD reaches several volts above the normal VDD operating range.

Transistors M2, M4 and M5 are all low width-to-length devices which have little impact on the protection circuit's behavior during the discharging of transient voltages. In particular, transistors M2, M4 and M5 are used to discharge nodes N1, N2 and N3, respectively, after an ESD transient has been processed by the protection circuit. This allows the protected MOS circuit to resume normal operation without having to first power the chip down and then back on.

The ESD protection circuit 150 of FIG. 2 works as follows. As in circuit 100 of FIG. 1, N-channel transistor M1 is used as a capacitor to couple positive going transients from VDD to node N1. P-channel transistors M6 and M8 are used to keep bipolar parasitic transistors Q1 and Q2 off during the initial VDD rising transition by tracking nodes N4 and N5, which keeps Q1 from turning on. As in FIG. 1, transistors M2 and M5 are used to discharge the internal nodes N1, N2 and N3 of the protection circuit 150 after an ESD transient has been processed.

Transistors M3, M4 and M7 are used to set the VDD trip point to turn on bipolar transistors Q1 and Q2. The VDD trip point is preferably set to several volts about the VDD normal operating range.

In both embodiments, more bipolar transistors can be cascaded to enable the protection circuit to absorb large ESD currents, if necessary. Furthermore, in both embodiments, the diodes 102 used to connect the I/O nodes to the protection circuit must be made sufficiently large so that these diodes do not become a bottleneck when the protection circuit is absorbing an ESD transient. The output nodes of many CMOS circuits are already connected to large P-channel transistors, which have large parasitic diodes connecting the output node to VDD. As a result, the required diode connections often already exist, at least for output nodes with large output driver circuits.

Under normal operation, VDD is at a nominal supply voltage and node N1 is pulled to ground (VSS) by transistor M2, which turns transistor M3 off. Bases of Q1 and Q2 are pulled low by transistors M4 and M5, respectively, in the protection circuit 100 of FIG. 1. Bases of Q1 and Q2 are pulled high by transistors M6 and M8, respectively, in the protection circuit 150 of FIG. 2. In both circuits the Darlington pair Q1-Q2 is turned off during normal operating conditions. Further, there is no danger of accidental turn-on of the Darlington pair during normal operation because a large VDD surge, typically more than 2.5 volts, is required to overcome the bipolar devices' base drive requirements. Thus a positive voltage transient having at least a predefined magnitude must occur on VDD before the Q1-Q2 will be turned on.

Figure 3:
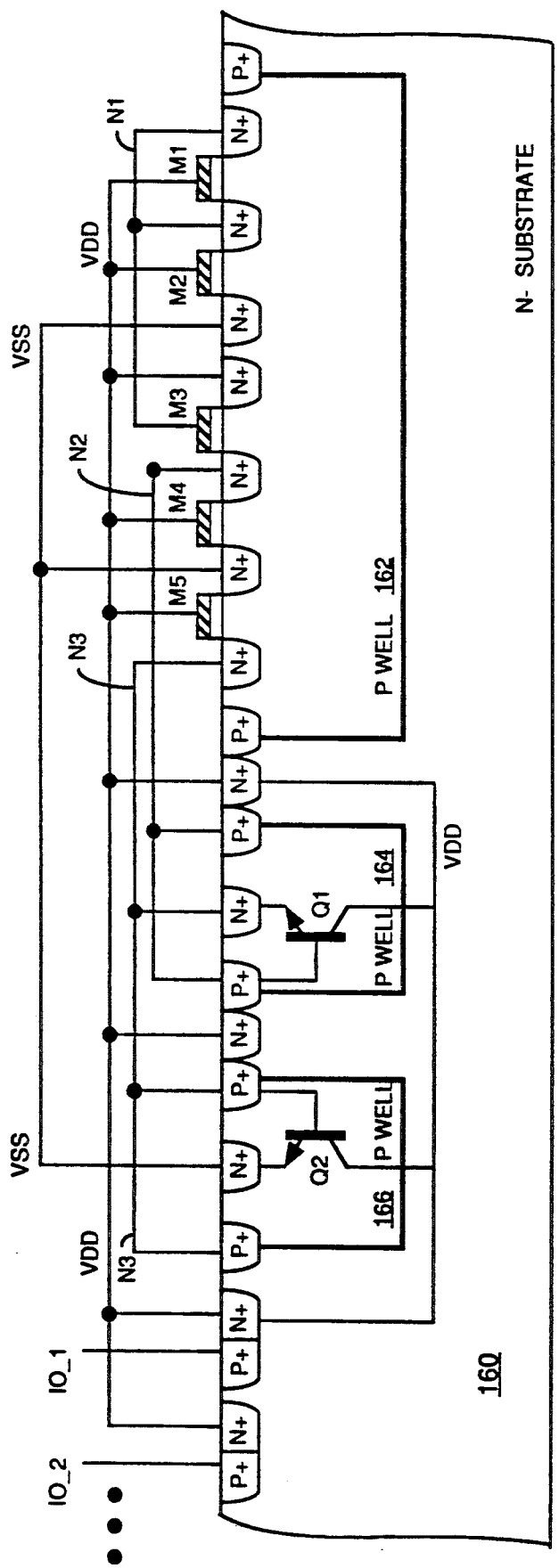
FIG. 3 depicts the profile and parasitic bipolar transistor model of the circuit shown in FIG. 1.

Referring to FIG. 3, there is shown a circuit profile of the protection circuit of FIG. 1, which is formed on a silicon N-substrate 160. The same labels are used for transistors M1-M5, nodes (I/O_x, N1-N3, VDD, and VSS) and parasitic devices Q1-Q2 as in FIG. 1. The N-channel transistors M1-M5 are formed in a first P-well 162, and the two parasitic bipolar transistors Q1-Q2 are formed in separate P-wells 164 and 166. It should be understood that the circuit profile shown is not drawn to scale, so that the relevant features can be more clearly represented. Furthermore, the parasitic bipolar devices Q1-Q2 shown in these profiles represent or model the operation of these circuits in certain circumstances—they do not represent additional components of the circuit. Since such parasitic structures are available on all CMOS chips, no modification of the manufacturing process is required in order to add the protection circuit of the present invention to such CMOS chips.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

In particular, while the preferred embodiment of the present invention is designed to protect CMOS circuits against positive voltage ESD, anyone skilled in the art could use the teachings of the present invention to generate a "mirror image" version of the above described positive voltage ESD protection circuit, which would protect against negative voltage ESD. In particular, all the I/O nodes could be coupled by diodes to the VSS node, with a Darlington pair of bipolar parasitic transistors being used to supply current to the VSS node in the case of a negative voltage ESD. By putting both the positive voltage ESD and negative voltage ESD circuits on the same CMOS chip, the chip would be protected against both positive and negative voltage electrostatic discharges.

What is claimed is:

1. In an MOS semiconductor circuit, a shared protection circuit coupled to a plurality of input/output pads and to other circuitry in the MOS semiconductor circuit, said shared protection circuit comprising:
    first and second voltage source nodes, one of said voltage sources node comprising a high voltage source node and the other comprising a low voltage source node;
    a multiplicity of diodes, each coupling a distinct input/output node to said first voltage source node so that a transient voltage of a predefined polarity on any input/output node is transmitted to said first voltage source node; and
    a Darlington pair of parasitic bipolar transistors, coupled to said first and second voltage source nodes so as to conduct charge from said first voltage source node to said second voltage source node when a transient voltage of said predefined polarity having at least a predefined magnitude occurs on said first voltage source node;
    whereby said shared protection circuit will drain current from any of said input/output nodes, via said first voltage source node, when a transient voltage of said predefined polarity occurs thereon.

2. The shared protection circuit of claim 1, wherein said circuit is formed in a semiconductor substrate of a first type and said Darlington pair of parasitic bipolar transistors comprise vertical bipolar structures formed in a well of semiconductor material of opposite type.

3. The shared protection circuit of claim 1, including a bias circuit for turning on said Darlington pair of parasitic bipolar transistors when a transient voltage of said predefined polarity having at least said predefined magnitude occurs on said first voltage source node; said bias circuit including means for automatically turning off said Darlington pair of parasitic bipolar transistors after said Darlington pair of parasitic bipolar transistors has drained current from said first voltage source node.

4. In an MOS semiconductor circuit, a shared protection circuit coupled to a plurality of input/output pads and to other circuitry in the MOS semiconductor circuit, said shared protection circuit comprising:
- a high voltage source node and a low voltage source node;
- a multiplicity of diodes, each coupling a distinct input/output node to said high voltage source node so that a positive voltage transient on any input/output node is transmitted to said high voltage source node; and
- a Darlington pair of parasitic bipolar transistors, coupled to said high voltage source node and a low voltage source node so as to conduct charge from said high voltage source node to said low voltage source node when a positive voltage transient occurs on said high voltage source node;

whereby said shared protection circuit will drain current from any of said input/output nodes, via said high voltage source node, when a positive voltage transient occurs thereon.

5. The shared protection circuit of claim 4, wherein said circuit is formed in a semiconductor substrate of a first type and said Darlington pair of parasitic bipolar transistors comprise vertical bipolar structures formed in a well of semiconductor material of opposite type.

6. The shared protection circuit of claim 4, including a bias circuit for turning on said Darlington pair of parasitic bipolar transistors when a positive voltage transient having at least a predefined magnitude occurs on said high voltage source node; said bias circuit including means for automatically turning off said Darlington pair of parasitic bipolar transistors after said Darlington pair of parasitic bipolar transistors has drained current from said high voltage source node.

* * * * *